(12) United States Patent
Voznyi et al.

(10) Patent No.: US 12,681,393 B2
(45) Date of Patent: Jul. 14, 2026

(54) SYSTEM AND METHOD FOR CONDITIONING OPTICAL APPARATUSES

(71) Applicant: ASML Netherlands B.V., Veldhoven (NL)

(72) Inventors: Oleg Viacheslavovich Voznyi, Eindhoven (NL); Bearrach Moest, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 568 days.

(21) Appl. No.: 18/015,155

(22) PCT Filed: May 31, 2021

(86) PCT No.: PCT/EP2021/064483
§ 371 (c)(1),
(2) Date: Jan. 9, 2023

(87) PCT Pub. No.: WO2022/008137
PCT Pub. Date: Jan. 13, 2022

(65) Prior Publication Data
US 2023/0251583 A1     Aug. 10, 2023

(30) Foreign Application Priority Data
Jul. 10, 2020     (EP) .................................... 20185138

(51) Int. Cl.
*G03F 7/00*          (2006.01)
(52) U.S. Cl.
CPC ...... *G03F 7/70633* (2013.01); *G03F 7/70558* (2013.01); *G03F 7/70716* (2013.01); *G03F 7/7085* (2013.01)

(58) Field of Classification Search
CPC ....................................................... G03F 7/70
See application file for complete search history.

(56) References Cited

U.S. PATENT DOCUMENTS

| | | | |
|---|---|---|---|
| 5,119,390 A | 6/1992 | Ohmori | |
| 6,952,253 B2 | 10/2005 | Lof et al. | |

(Continued)

FOREIGN PATENT DOCUMENTS

| | | | | |
|---|---|---|---|---|
| EP | 0 833 193 A2 | 4/1998 | | |
| EP | 2028547 A1 * | 2/2009 | ........... | G03F 7/7045 |

(Continued)

OTHER PUBLICATIONS

International Search Report and Written Opinion of the International searching Authority directed to International Patent Application No. PCT/EP2021/064483, mailed Sep. 28, 2021; 13 pages.

(Continued)

*Primary Examiner* — Chanceity N Robinson
(74) *Attorney, Agent, or Firm* — FINNEGAN, HENDERSON, FARABOW, GARRETT & DUNNER LLP

(57) ABSTRACT

Disclosed is a stage system, which comprises a pre-exposure element, and to a method employing the pre-exposure element for conditioning an optical system. The pre-exposure element comprises a radiation receiving area at a surface of the stage system, wherein the radiation receiving area comprises at least one pre-exposure plate configured to receive radiation. The stage system comprises further a controller, wherein the controller is capable to control an optical parameter of the pre-exposure element, herewith controlling a portion of received radiation reflected by the pre-exposure element.

16 Claims, 5 Drawing Sheets

(56) References Cited

U.S. PATENT DOCUMENTS

| | | | | |
|---|---|---|---|---|
| 7,053,989 | B2 | 5/2006 | Kawahara | |
| 8,081,292 | B2 | 12/2011 | Nishino et al. | |
| 10,831,085 | B2 | 11/2020 | Akiyama | |
| 2001/0043321 | A1* | 11/2001 | Nishi | G03F 7/70558 |
| | | | | 355/71 |
| 2002/0190228 | A1* | 12/2002 | Suzuki | G03F 7/70133 |
| | | | | 250/548 |
| 2007/0108377 | A1* | 5/2007 | Kok | G03F 7/7085 |
| | | | | 250/234 |
| 2009/0073409 | A1 | 3/2009 | Nishino et al. | |
| 2020/0159126 | A1 | 5/2020 | Butler et al. | |

FOREIGN PATENT DOCUMENTS

| | | |
|---|---|---|
| JP | H03-068185 A | 3/1991 |
| JP | H11-238680 A | 8/1999 |
| JP | 2002-014005 A | 1/2002 |
| JP | 2004-266208 A | 9/2004 |
| JP | 2007-142238 A | 6/2007 |
| JP | 2008-211055 A | 9/2008 |
| JP | 2009-071103 A | 4/2009 |
| JP | 2011-166013 A | 8/2011 |
| JP | 2012-134290 A | 7/2012 |
| JP | 2015-065360 A | 4/2015 |
| JP | 2019-152752 A | 9/2019 |
| KR | 2009-0017982 A | 2/2009 |

OTHER PUBLICATIONS

International Preliminary Report on Patentability directed to International Patent Application No. PCT/EP2021/064483, issued Jan. 10, 2023; 10 pages.
Korean Request for the Submission of an Opinion directed to Korean Patent Application No. 10-2023-7001063, mailed Nov. 4, 2025; 11 pages.

* cited by examiner

SYSTEM AND METHOD FOR CONDITIONING OPTICAL APPARATUSES

CROSS-REFERENCE TO RELATED APPLICATIONS

This application claims priority of EP application 20185138.3 which was filed on 10 Jul. 2020, and which is incorporated herein in its entirety be reference.

FIELD

The present invention relates to lithography, and more particularly to systems and methods for conditioning optical apparatuses, especially to lithography apparatuses to improve imaging performance, e.g., overlay and/or focus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer) by means of a projection system.

In a lithographic apparatus, a result of substrate exposure by radiation in a lithographic apparatus, the optical path, comprising the patterning device, the projection system, and the illumination system of the lithographic apparatus, is heated up by the exposure radiation. That is, the dose of radiation received by the projection system causes heating and subsequent cooling of the projection system. Herewith, the projection system induces some aberrations in the projected image, therewith adversely affecting imaging performance, e.g., overlay and/or focus, of the lithographic process.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable the creation of increasingly smaller features. The smaller the features, the greater the need to overcome aberrations in the projected image.

It is known that heating effects can be calculated in advance by using mathematical models. These models are helpful in determining (expected) aberrations of the projected image caused by the heating effect. With the knowledge of the expected aberration, corrections may be applied by introducing compensating aberrations. These counter measures may be provided by adjustable lens elements arranged in the projection system. Herewith, the effect of reticle and lens heating may be at least mitigated.

With increasing demands on imaging performance of a lithographic apparatus, the complexity of the model increases. In an effort to effectively correct for the effects of reticle and lens heating, the increasing complexity of the model may result in overfitting, increased numerical effort, and/or erroneous fitting. The corrections may be based on preceding measurement results, e.g., aberration measurements results, and optical model results. But at a start of a wafer lot exposure, the lithographic apparatus is relatively cold and the corrections may be insufficient and/or inaccurate. Herewith, overlay may deteriorate and may result in a reduced number of yielding dies.

SUMMARY

It is an object of the invention to provide various aspects of systems, apparatuses, methods, and computer program products for conditioning the optical path within an optical system, e.g., a lithographic apparatuses, which obviates or mitigates a problem associated with the prior art.

The present invention relates to a system (e.g., a stage system) that comprises a pre-exposure element for conditioning an optical system. The pre-exposure element comprises a radiation receiving area at a surface of the stage system, wherein the radiation receiving area comprises at least one pre-exposure plate configured to receive radiation. The stage system comprises further a controller, wherein the controller is capable to control an optical parameter of the pre-exposure element, herewith controlling a portion of received radiation reflected by the pre-exposure element. The pre-exposure element may be arranged and positioned to reflect radiation towards one or more optical elements, especially towards a projection system that is used for exposures of semiconductor substrates. Control over the amount of reflected radiation, by the pre-exposure element, enables an improved control of (thermally) conditioning optical elements arranged in the optical system.

The system of present invention may be a part of the optical system, for example a stage system arranged in a lithographic apparatus.

The pre-exposure element arranged at the stage system may further comprise an at least partially reflective optical member and the controller may be arranged to control the optical property of the pre-exposure element by controlling the reflectivity of the at least partially reflective optical member. The reflectivity of the at least partially reflective optical member may further be controlled by positioning of the at least partially optical member, e.g., by providing a tilt or a rotation to the optical member, herewith changing the effective reflectivity of the optical member.

According to an embodiment of the present invention the optical parameter of the pre-exposure element is controlled and adjusted by means of an electrotuneable optical element, which is capable to change between a reflective state and a transmissive state by means of an electric signal.

In an embodiment of the present invention, the pre-exposure element comprises one or more detectors to measure a radiation intensity. The measured radiation intensity may be a measure for the radiation received by the pre-exposure element. The measurement results may be used to tune the optical parameter of the pre-exposure element and or to control a pre-exposure sequence.

According to an embodiment of the present invention, the pre-exposure element comprises a plurality of pre-exposure plates, each pre-exposure plate having a reflectivity different from each other, wherein the optical parameter of the pre-exposure element is controlled by selecting one from the plurality of pre-exposure plates.

The present invention also relates to a method of conditioning an optical system by employing a pre-exposure element. The method comprising: defining exposure parameters of the optical system, for exposing one or more substrates, initializing the optical system according the defined exposure parameters, herewith at least controlling and setting an optical parameter of the pre-exposure element, exposing the pre-exposure element with radiation, using at least the radiation reflected from the pre-exposure element for conditioning the optical system, and stopping the exposure of the pre-exposure element with radiation, as the optical system is at a conditioned state.

The method may further comprise loading a substrate onto a substrate holder, measuring at least a position of a feature at the substrate, using an alignment sensor, measuring a height of the substrate, using a height sensor, receiving at a controller a signal indicating that at least one of the position measurement, the height measurement, and the exposure of the pre-exposure element is finished.

Further embodiments, features and advantages of the present invention, as well as the structure and operation of the various embodiments, features and advantages of the present invention, are described in detail below with reference to the accompanying drawings.

BRIEF DESCRIPTION OF THE DRAWINGS

Embodiments of the invention will now be described, by way of example only, with reference to the accompanying schematic drawings, in which.

The features shown in the figures are not necessarily to scale, and the size and/or arrangement depicted is not limiting. It will be understood that the figures include optional features, which may not be essential to the invention. Furthermore, not all of the features of the system are depicted in each of the figures, and the figures may only show some of the components relevant for a describing a particular feature.

DETAILED DESCRIPTION

Figure 1:
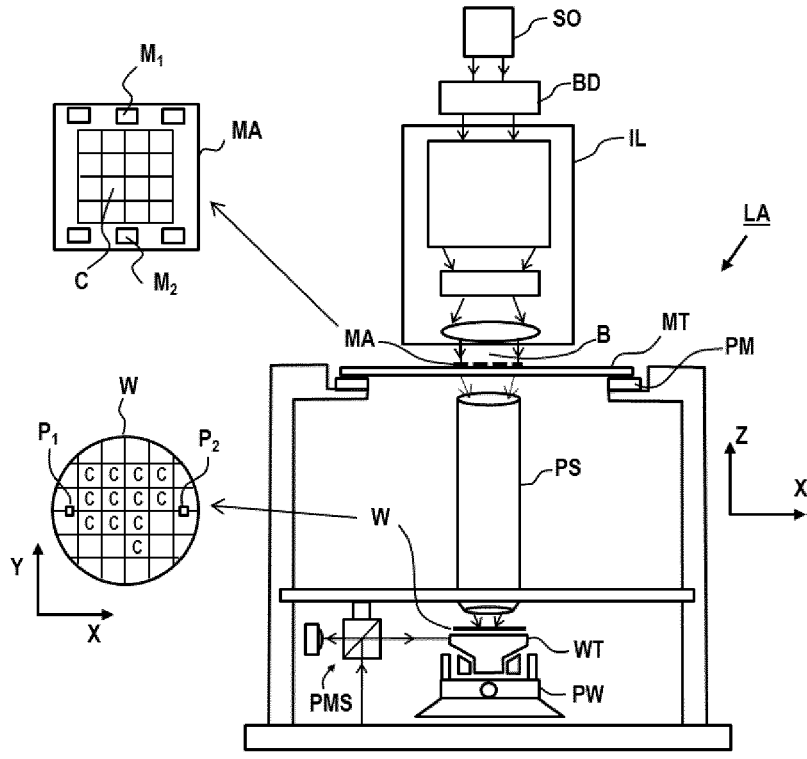
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, electromagnetic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, and/or electromagnetic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor. The sensor may be arranged to measure a property of the projection system PS or a property of the radiation beam B. The measurement stage may hold multiple sensors. The measurement stage may move beneath the projection system PS when the substrate support WT is away from the projection system PS.

In operation, the radiation beam B may be incident on the patterning device, e.g. mask, MA which is held on the mask support MT, and is patterned by the pattern (design layout) present on patterning device MA. Having traversed the mask MA, the radiation beam B passes through the projection system PS, which may focus the beam onto a target portion C of the substrate W or onto a sensor arranged at a stage. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C. Substrate alignment marks P1, P2 may also be arranged in the target portion C area as in-die marks. These in-die marks may also be used as metrology marks, for example, for overlay measurements.

To clarify the invention, a Cartesian coordinate system is used. The Cartesian coordinate system has three axis, i.e., an X-axis, a Y-axis and a Z-axis. Each of the three axis is orthogonal to the other two axis. A rotation around the x-axis is referred to as an Rx-rotation. A rotation around the Y-axis is referred to as an Ry-rotation. A rotation around about the Z-axis is referred to as an Rz-rotation. The X-axis and the Y-axis define a horizontal plane, whereas the Z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the Z-axis has a component along the horizontal plane.

Figure 2:
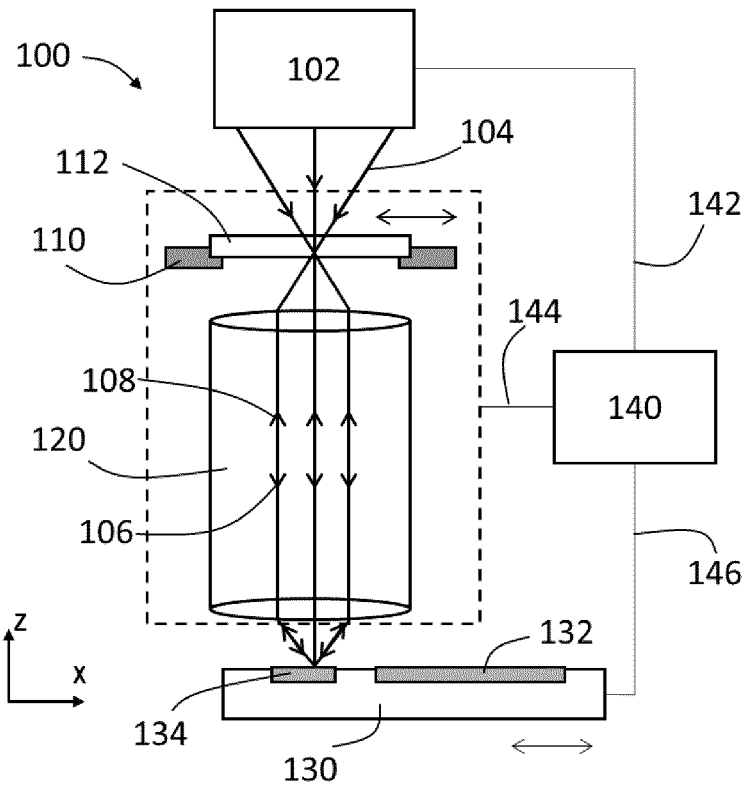
FIG. 2 depicts a schematic illustration of an optical system according to some aspects of the present disclosure.

FIG. 2 illustrates an aspect of the present disclosure for an optical system 100 that includes a stage system 130. The optical system 100 may be a lithographic apparatus LA similar as depicted in FIG. 1. The stage system 130 may, for example, be a substrate support WT arranged to support a substrate W, 132. An illumination system 102 may be arranged to provide radiation 104 such that the radiation 104 interacts with a patterning device 112, which may be supported by a support 110, e.g., a mask support MT. After interaction with the patterning device 112, a patterned radiation 106 may be captured by a projection system 120 that is arranged to guide the patterned radiation 106 towards the stage system 130 (illustrated downstream in the illustrations). The projection system 120 may be configured to focus the patterned radiation 106 onto the semiconductor substrate 132, e.g., a wafer, or onto a pre-exposure element 134. In a situation wherein the patterned radiation 106 interacts with the pre-exposure element 134, a portion of the radiation may reflect back towards the projection system 120, where it may be received by a lens element of the projection system 120 facing the pre-exposure element 134, and the reflected radiation 108 is guided (upstream) by the projection system 120 towards the patterning device 112. Herewith, the projection system 120 may experience, and may interact with, radiation going downstream (i.e., patterned radiation 106) and radiation going upstream (i.e., reflected radiation 108).

The optical system 100, e.g., a lithographic apparatus, may comprise a controller 140 that is arranged to control by means of an illumination control signal 142 the illumination system 102. Herewith, controlling properties and characteristics of the radiation 104 that may be provided by the illumination system 102. Controlled properties of the radiation 104 may comprise intensity, polarisation, wavelength, illumination profile, pulse sequence, pulse duration, et cetera.

Via illumination control signal 142, information of the illumination system 102 may also be received by the controller 140. Thus, the illumination control signal 142 may be a signal to provide information from the illumination system 102 to the controller 140 and to provide a control signal from the controller 140 to the illumination system 102.

The controller 140 (or control unit) may also be arranged to provide a projection control signal 144, in order to control, for example, the position of the patterning device 112 and or to control, for example, the position and orientation of individual optical elements (for example, individual lenses and or mirrors) arranged in the projection system 120. The projection control signal 144 may also be suitable to change a shape of one or more optical elements arranged in the projection system 120, for example by deforming one or more optical elements, or to change an optical property of one or more optical elements, for example, by changing the refractive index of one or more optical elements. Via projection control signal 144, information of the projection system 120 may also be received by the controller 140. Thus, the projection control signal 144 may be a signal to provide information from the projection system 120 to the controller 140 and to provide a control signal from the controller 140 to the projection system 120.

In addition, the controller 140 may provide a stage control signal 146 to control the position and or orientation of the stage system 130. By means of the stage control signal 146, the stage system 130 may be positioned such that the substrate 132 is positioned underneath the projection system 120, for example, in order to expose the substrate 132 by the patterned radiation 106 (for example, during an exposure sequence). The stage control signal 146 may also initiate the stage system 130 to move such that the pre-exposure element 134 is positioned underneath the projection system 120, and herewith arranged to receive the patterned radiation 106 from the projection system 120. The stage control signal 146 from the controller 140 may comprise a signal to control a property of the pre-exposure element 134, for example to control an optical property of the pre-exposure element 134.

Via stage control signal 146, information of the stage system 130 may also be received by the controller 140. The signal received by the controller 140 from the stage system 130 may comprise a signal and information from the pre-exposure element 134. Thus, the stage control signal 146 may be a signal to provide information from the stage system 130 to the controller 140 and to provide a control signal from the controller 140 to the stage system 130.

An exposure sequence, using a lithographic exposure apparatus, typically comprises the steps of substrate (wafer) loading, substrate measurement (e.g., wafer alignment, height measurements, metrology), alignment of the patterning device (e.g., reticle alignment), substrate exposure, and substrate unloading. Alignment of the patterning device is performed before the exposure of the substrate and typically this step is used to align the patterning device with the substrate that is to be exposed in the apparatus. During each substrate exposure step the substrate, the patterning device, the projection system, as well as the illumination system are heated by the radiation that is used for the exposure of the substrate. The resulting heating effect may negatively affect overlay performance of the lithographic apparatus. Based on measurements and alignment parameters, corrections may be applied to the illumination system, the patterning device, the projection system, and or the stage system to compensate or to correct for the heat induced effects. These corrections may be applied via the control signals 142, 144, 146 as provided by the controller 140, as explained above. As the alignment of the patterning device 112 is measured and performed before exposure of a substrate 132 (e.g., a wafer in a wafer lot), the heat induced effects accumulated during the actual substrate exposure are not measured and are not corrected.

Calibrations regarding heating effects may be taken into account by mathematical models to provide corrections to settings of, for example, the patterning device 112 and the projection system 120. These corrections are typically governed by the initial temperature of the projection system and the patterning device. In addition, the optical parameters of the patterning device, e.g., the reflectivity and or the transmission of the patterning device, as well as the amount of exposure radiation reflected back from the substrate determine the heat load experienced by the patterning device and the projection system. Since the initial temperature of the projection system may vary during operation of the lithographic apparatus, and as various patterning devices with different optical properties may be used, the corrections as suggested by the mathematical models may be inaccurate. To improve the apparatus heating calibration and corresponding mathematical models, heating calibrations need to be performed for each combination of patterning device and substrate (or substrate variant). Not only would this impact the availability of the lithographic apparatus, for example affecting the wafer throughput, it would not be feasible for a continuously advancing manufacturing process.

Figure 3:
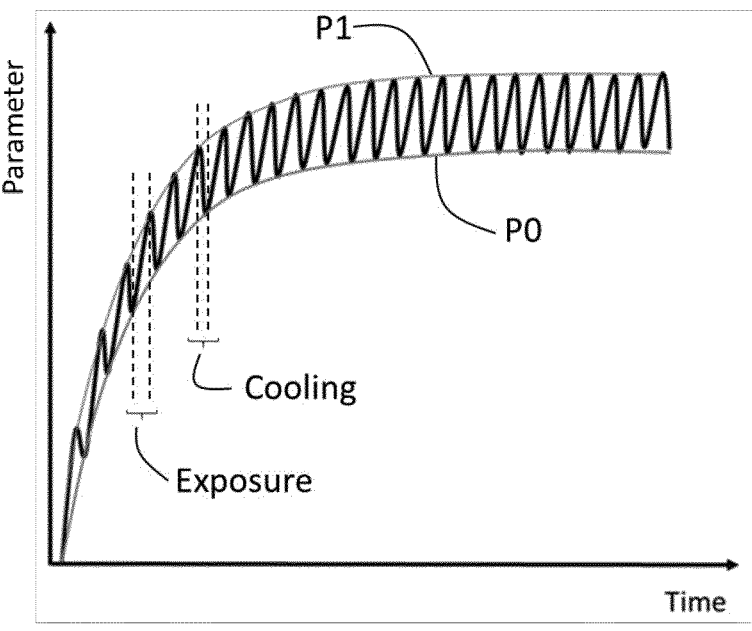
FIG. 3 depicts a graph displaying a parametric change as a function of time during an exposure sequence.

FIG. 3 illustrates a typical transient behaviour of an optical system 100 during interaction with radiation, for example a projection system PS during exposure of a series of substrates W by exposure radiation B. The parameter, as displayed on the y-axis of the graph, may represent a temperature of an optical element (e.g., reflective or refractive element) arranged in the optical system 100 (e.g., an optical element in the projection system PS, 120 as illustrated by FIG. 1, 2), or an average temperature of one or more optical elements of the optical system 100, a temperature of a patterning device (e.g., patterning device MA, 112 as illustrated by FIG. 1, 2), or an average temperature of the patterning device MA, 112, or a combination of both the patterning device MA, 112 and one or more optical elements within the projection system PS, 120. The parameter may also represent an optical property of the projection system PS, 120 and or the patterning device MA, 112, for example, a measure of an optical aberration. The optical aberration may be described in terms of Zernike polynomials.

During exposure of a substrate W, 132 by radiation, the parameter of the optical system (e.g., the temperature of the projection system PS, 120 and or the patterning device MA, 112) may change under influence of the provided radiation. For example, the average temperature of the projection system PS, 120 may increase under influence of the radiation, which is known as lens heating. A similar heating effect may occur at the patterning device MA, 112, which is known as reticle heating. After exposure, thus without radiation present (or non-exposure), the parameter of the optical system (e.g., the temperature of the projection system PS, 120 and or the patterning device MA, 112) may return (at least partly) to a previous value. For example, the temperature of the projection system PS, 120 lowers, which is known as lens cooling. A similar cooling effect may occur at the patterning device MA, 112, which is known as reticle cooling. By a repetition sequence of exposure and non-exposure actions, a sawtooth-like transient behaviour may be observed. The increasing parts of the sawtooth-like curve may represent a thermal increase of at least a portion of the system (e.g., reticle and or lens heating) under influence of exposure radiation, and the decreasing parts of the sawtooth-like curve may represent a thermal decrease of at least a portion of the system (e.g., reticle and or lens cooling). Before each substrate exposure during an exposure sequence, the parameter of the optical system (e.g., the temperature the projection system PS, 120 and or the patterning device MA, 112) may be represented by a first parameter curve P0. Whereas the parameter of the optical system after each substrate exposure during the exposure sequence may be represented by a second parameter curve P1. Data points on the first parameter curve P0 and the second parameter curve P1 may represent an initial and a final temperature of an element arranged in the optical system 100, respectively. As illustrated by the graph in FIG. 3, the parameter (e.g., temperature or a specific aberration term) approaches a saturation level after a plurality of exposures. At such a saturation level, the parametric change under influence of radiation becomes much less than the parametric change at the begin of the exposure sequence. The mathematical models are at this saturated or conditioned state much more accurate, which means that the corrective actions based on the mathematical models are more efficient to correct or to compensate the radiation induced effects. The number of exposures, which is required to reach a saturation level, is governed by the actual exposure parameters, e.g., radiation fluence per pulse, number of pulses, duty cycle, illumination profile, et cetera.

Reduction of the heating effect on the performance of the lithographic apparatus, for example the heat-induced aberrations, may be obtained by thermal stabilization of the lithographic apparatus. Not to sacrifice production substrates (e.g., wafers of a lot) for this purpose, dummy exposures on non-production wafers may be used. By means of pre-exposure cycles using non-production wafers, stabilization of the lithographic apparatus may be obtained. However, these non-production wafers may not represent the production wafers that will be used for manufacturing of the integrated circuits. That is, a material layer (or layer stack), which is provided at the (production) wafer governs the optical response of the wafer when interacting with radiation, may differ from the material provided on non-production wafers. Hence, their optical responses may differ. That is, the amount of reflected (and absorbed) radiation by the wafer depends on the optical properties of the material layer (stack). And herewith, the amount of radiation experienced by the optical system depends on the interaction of the radiation with the wafer. Thus, a change in an optical property of the wafer (or material stack) changes the properties of the radiation reflected by the wafer, which in turn is received and experienced by the optical system.

As said, stage system 130 may be controlled by controller 140, whereby the substrate 132 or the pre-exposure element 134 may be positioned beneath the projection system 120. Patterned radiation 106 may be guided by the projection system 120 to be projected at the pre-exposure element 134. A portion of the patterned radiation 106 may, after interaction with the pre-exposure element 134, reflect back towards the projection system 120, where the reflected radiation 108 may be received by the projection system 120 and guided upstream towards the patterning device 112.

In order to thermally stabilize an optical system, for example a projection system 120 arranged in a lithographic apparatus, before using the system in a production sequence, the pre-exposure element 134 may be used. The purpose of the pre-exposure element 134 is to reflect at least a portion of radiation towards the projection system 120 during a pre-exposure sequence in order to condition the projection system 120, e.g., thermal stabilization or stabilization in terms of optical aberrations, instead of using (non)production substrates. The back reflected radiation is used to thermalize, and herewith to condition, the projection system 120 (and the patterning device 112) under similar conditions as during normal operation of the lithographic apparatus, when substrates with different optical properties, e.g., material layers, are used.

Figure 4A:
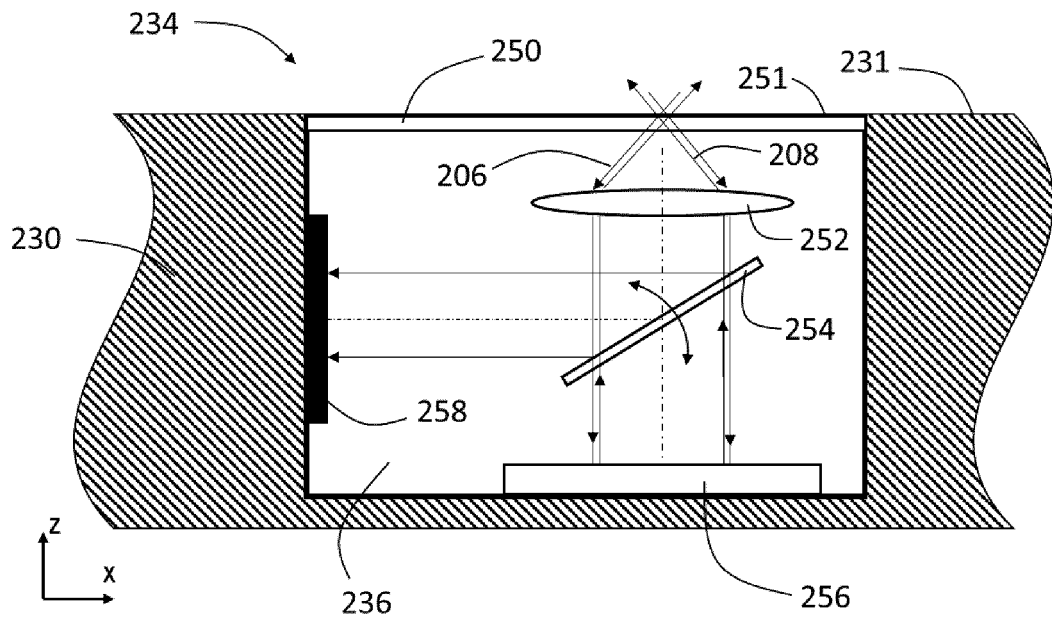
FIGS. 4A and 4B are schematic illustrations of a pre-exposure element according to some aspects of the present disclosure.
Figure 4B:
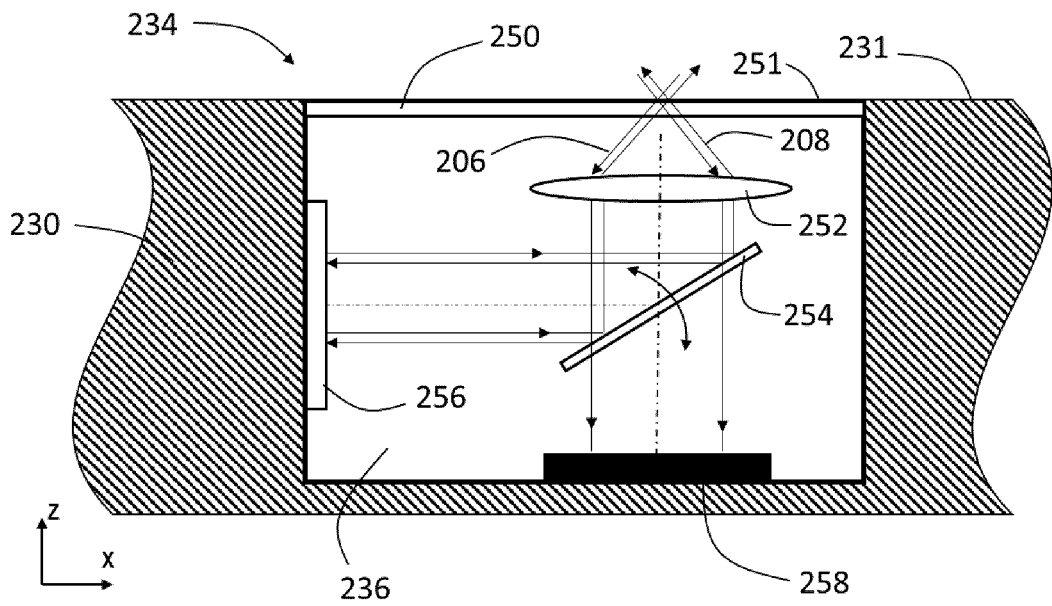

FIGS. 4A and 4B depict cross-sectional illustrations of two embodiments of a pre-exposure element 234 that may be used as the pre-exposure element 134 arranged at the stage system 130, as illustrated by FIG. 2. The pre-exposure element 234 may be arranged in a pocket at a top surface 231 of the stage system 230 (130 in FIG. 2). The pre-exposure element 234 comprises a radiation receiving area at a surface of the stage system, wherein the radiation receiving area comprises an auxiliary plate 250 for receiving radiation (irradiation light). The auxiliary plate 250 having a plate surface 251 at substantially a same height as the stage surface 231 of the stage system 230. Radiation 206 (the patterned radiation 106 as illustrated by FIG. 2) may be received by the radiation receiving area (or by the auxiliary plate 250) at the plate surface 251. At least a portion of the received radiation 206 propagates towards a first optical member 252, which may be a refractive lens or a reflective element (e.g., a mirror) arranged as a collimating optical element to guide and/or to shape the received radiation 206. The pre-exposure element 234 may further comprise a second optical member 254, configured as a at least partially transmissive reflective element arranged to interact with radiation that has interacted with the first optical member 252. By interaction of the received radiation 206 with the second optical member 254, at least a first portion of the received radiation 206 passes through the second optical member 254 and a second portion may be reflected by the second optical member 254. The first portion of radiation may be projected onto a reflective member 256, as illustrated in FIG. 4A, or onto an absorbing member 258, as illustrated by FIG. 4B. The second portion of radiation may be reflected towards the absorbing member 258, as illustrated in FIG. 4A, or towards the reflective member 256, as illustrated in FIG. 4B.

The reflective member 256 is a high-reflective mirror configured to retro-reflect the impinging radiation back onto the second optical member 254. The retro-reflected radiation interacts for a second time with the second optical member 254. At least a portion of the retro-reflected radiation propagates towards the first optical member 252, where the retro-reflected radiation is guided further towards the auxiliary plate 250, and forming a reflected radiation 208 (the reflected radiation 108 in reference to FIG. 2). After passing the auxiliary plate 250 (illustrated upwards in the illustrations), the reflected radiation 208 may interact with the bottom part of the projection system 120. The reflected radiation 208 may be (at least partially) received by the projection system 120 and guided towards the patterning device 112.

The auxiliary plate 250 arranged at the pre-exposure element 234 may be used to receive radiation during a pre-exposure sequence. Therefore, the auxiliary plate 250 may also be referred as a pre-exposure plate.

The absorbing member 258 is configured to absorb all radiation that impinges its surface. Hence, no or only a negligible portion of the impinging radiation is reflected from the absorbing member 258.

To control the amount of radiation that returns to the projection system 120, and herewith to control the conditioning of the projection system 120, the reflectivity and transmissivity of the second optical member 254 can be set and controlled. The second optical member 254 may act as a tuneable attenuator. For example, the reflection (transmissivity) of the second optical member 254 can be set to a value in the range between 99% and 1% (1% and 99%) for a single pass. In another example, the second optical member 254 may be set as a half-transmission mirror, such that approximately 50% of the radiation that interacts with the second optical member 254 passes the second optical member 254. Radiation that returns, thus the radiation reflected by the reflective member 256 (FIG. 4A), will also be attenuated by approximately 50% as it passes the second optical member 254 for the second time. Thus, the reflected radiation 208 may have an amplitude (or intensity) of approximately 25% of the amplitude of the receive radiation 206 before interaction with the second optical member 254.

In an embodiment, the second optical member 254 is an electrotuneable filter that is capable to change between a (at least partially) reflective state and a transmissive state, herewith acting as a reflective mirror and a transmissive window, respectively. The reflective state and transmissive state can be selected and set by means of an electronic signal. For example, by means of a signal provided by the controller 140, e.g., the stage control signal 146. The second optical member 254 in this configuration may be a so-called smart-glass. By controlling and changing the optical properties of the second optical member 254, the optical properties of the pre-exposure element 234 can be controlled and changed.

The reflectivity value of the tuneable second optical member (the electrotuneable filter or tuneable attenuator) may be a value within a discretised range or a continuous range between 1% and 99%.

As illustrated by the double-headed arrow in FIGS. 4A and 4B, the second optical member 254 may be rotatable. In this exemplary configuration, the reflectivity and transmissivity of the second optical member 254 as experienced by the impinging radiation may be controlled by rotating/tilting the second optical member 254 around a point on a central axis. The central axis may coincide with a centerpoint of the second optical member. In this arrangement, the reflectivity and transmissivity is governed by the rotation angle of the second optical element 254 with respect to the incident beam of radiation. Herewith, controlling a first amount of radiation that is projected onto the reflective member 256 and controlling a second amount of radiation that is projected onto the absorbing member 258, and hence, controlling an amount of radiation returning to the projection system 120.

In an embodiment, a first optical detector may be arranged at the location of the absorbing member 258. By means of the first optical detector, a portion of the fluence or intensity of the received radiation 206 can be measured. That is, the radiation intensity measured by the first optical detector is a measure of the received radiation 206. The first optical detector may be arranged to provide a signal that may be received by a controlling unit, for example, the controller 140 as illustrated in FIG. 2. Based on the detector measurement, corresponding to the received radiation 206, the controller 140 may control and adjust an optical parameter of the second optical member 254, and herewith controlling and adjusting an optical parameter of the pre-exposure element 234.

The pre-exposure element 234 may be provided with a second optical detector (not illustrated). The second optical detector may be arranged to measure at least a portion of the retro-reflected radiation. For example, the second optical detector may be provided near the second optical member 254. For example, the second optical detector may be provided at a backside of the second optical member 254.

Measurement results obtained by the first and or second optical detector may be used to tune the optical parameter of the pre-exposure element 234, for example for controlling and adjusting the amount of radiation reflected by the pre-exposure element 234. The measurements results may also be used to control a pre-exposure sequence.

The first optical member 252 and the second optical member 254 may be combined to form a single optical member. For example, the single optical member may be a concave mirror arranged as a collimating optical member to guide the received radiation 206. The reflectivity and transmissivity of the concave mirror may be controlled and changed in a similar manner as the control and change as used for the second optical member 254 (as described above).

A stage control unit may be arranged in the stage system, which may be provided to control and to set the optical parameter of the second optical member 254. The stage control unit may communicate via the stage control 146 signal with the controller 140. The stage control unit may be part of the controller 140 (or control unit), and may be included when referring to the controller 140 in context of controlling the pre-exposure element 234.

In an embodiment, the auxiliary plate 250 is a quartz plate.

In an embodiment, the auxiliary plate 250 may comprise a coating layer at the plate surface 251, wherein the coating layer is provided at a portion of the plate surface 251. In an embodiment, the coating is a liquid repellent coating. For example, the coating is a hydrophobic coating, which may be beneficial when the pre-exposure element 234 is used in an immersion based system, comprising water.

In an exemplary embodiment, the coating layer is provided at an area near the periphery of the auxiliary plate 250. The coating layer provided at a portion of the plate surface 251 may comprise chrome. A pattern may be provided at the coating layer, that can be used for alignment and or metrology measurements. The pattern may also be provided for identification of the pre-exposure element 234 and or the auxiliary plate 250.

A sealing member may be provided at a portion of the stage surface 231 and at a portion of the auxiliary plate 250 to close a gap between the stage system 230 and the pre-exposure element 234. This may be beneficial to prevent contamination entering an area 236 enclosed by the pre-exposure element 234.

In an embodiment, the sealing member may be arranged to cover at least a portion of the plate surface 251 and a portion of the stage surface 231 (not illustrated in FIGS. 4A and 4B). The sealing member may comprise a metallic film, for example a stainless steel film. The sealing member may comprise synthetic materials forming, for example, a polyimide film, a fluoropolymer film, or a polyester film.

A liquid repellence treatment may be performed at a surface of the sealing member. This may be beneficial for removal of liquids, for example, droplets at a surface of the sealing member.

In another embodiment, the sealing member may be arranged to enclose a periphery of the auxiliary plate 250 (the pre-exposure plate) in order to close a gap between the auxiliary plate 250 and the stage system 230, or a gap between the pre-exposure element 234 and the stage system 230 (not illustrated in FIGS. 4A and 4B). A closed-loop sealing member may be used. The sealing member may comprise elastic materials in order to adapt its shape to the shape of the gap. A groove may be provide at the pocket of the stage system 230 in order to embed the sealing member.

In an embodiment, the enclosed area 236 may be purged with a purging fluid. Purging may be beneficial to minimize contamination of the optical parts arranged in the enclosed area 236, e.g., first optical element 252 and second optical element 254. The purging fluid may also be used to control the temperature of the enclosed area 236, including the optical parts arranged therein.

Figure 5:
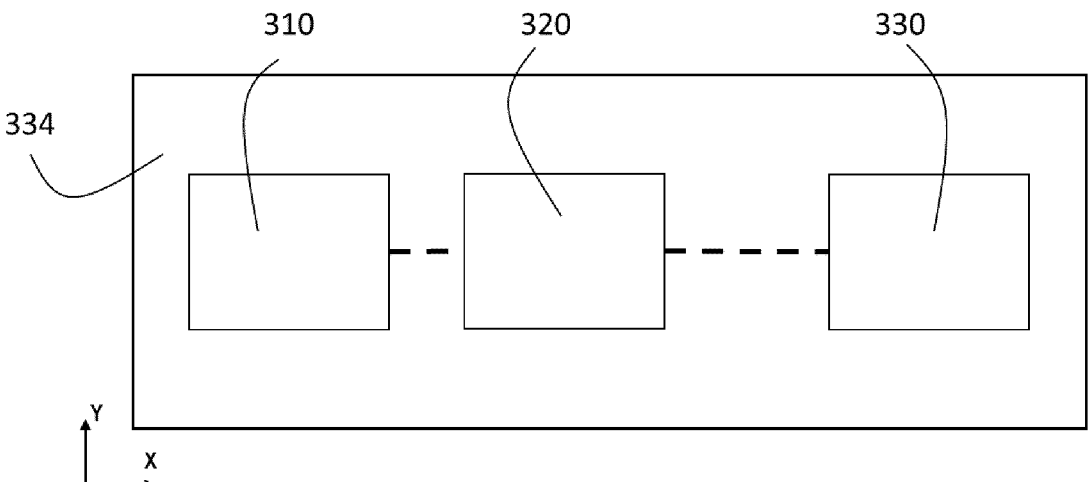
FIG. 5 depicts a schematic illustration of a pre-exposure element according to some aspects of the present disclosure.

FIG. 5 depicts a top-view illustration of an embodiment of a pre-exposure element 334 that may be used as the pre-exposure element 134 arranged at the stage system 130, as illustrated by FIG. 2. The pre-exposure element 334 may be arranged in a pocket at a top surface of the stage system 130. The pre-exposure element 334 may comprise one or more pre-exposure plates 310, 320, 330 configured to receive radiation (or irradiation light). The one or more pre-exposure plates 310, 320, 330 may have a predefined reflectivity. In an embodiment, the pre-exposure element 334 comprises two or more pre-exposure plates, with each pre-exposure plate 310, 320, 330 having a different reflectivity with respect to each other.

A stage system 130 comprising the pre-exposure element 334 may be controlled by the controller 140, for example by the stage control signal 146, to position the pre-exposure element 334 underneath the projection system 120. More specifically, by positioning one of the one or more pre-exposure plates 310, 320, 330 within the optical path beneath the projection system 120, the patterned radiation 106 is reflected by one of the one or more pre-exposure plates 310, 320, 330 and herewith providing reflected radiation 108 that may interact with at least the bottom part of the projection system 120. Hence, the control unit, e.g., the controller 140, may be used to control an optical parameter, e.g., the reflectivity, of the pre-exposure element 334 by selecting at least one pre-exposure plate 310, 320, 330 to be used during a pre-exposure sequence or exposure cycle.

In a situation, wherein the pre-exposure element 334 comprises a plurality of pre-exposure plates 310, 320, 330 each with a reflectivity different from each other, the amount of reflected radiation 108 can be controlled by selecting and positioning the pre-exposure plate 310, 320, 330 having the required optical characteristics, e.g., reflectivity, at the optical path beneath the projection system 120. The control may be provided by means of stage control signal 146, as illustrated in FIG. 2.

In a further embodiment, the pre-exposure element 334 comprises at least one pre-exposure plate 310, 320, 330 with controllable reflectivity. The controllable (or tuneable) reflectivity may be electrotuneable. The tuneable reflectivity may be controlled by providing a voltage to the at least one pre-exposure plate 310, 320, 330 and herewith setting and controlling the optical parameter of the pre-exposure element 334. The pre-exposure plate 310, 320, 330 with controllable reflectivity may be an electrotuneable optical element that is capable to change between a reflective state and a transmissive state by means of an electronic signal. The electric signal may be part of the stage control signal 146 provided by the controller 140. The reflectivity value of the tuneable pre-exposure plate 310, 320, 330 may be governed by a voltage applied to the tuneable pre-exposure plate 310, 320, 330.

A stage control unit may be arranged in the stage system, which may be provided to control and to set the optical parameter of the pre-exposure element 334. The stage control unit may communicate via stage control 146 signal with the controller 140. Herewith, the controller 140 may be used to control the optical parameter of the at least one pre-exposure plate 310, 320, 330, for example via the stage control signal 146 and via the stage control unit, and herewith controlling the optical parameter of the pre-exposure element 334. The stage control unit may be part of the controller 140, and may be included when referring to the controller 140 in context of controlling the pre-exposure element 334.

The overall shape of the pre-exposure element 334 may be a square, a rectangle, a circle, an oval, or a triangle. In general, the pre-exposure element 334 and the pre-exposure plate 310, 320, 330 are not limited to any overall shape.

A sealing member may be provided at a portion of the stage system 130 and at a portion of the pre-exposure element 334 to close a gap between the stage system 130 and the pre-exposure element 334, herewith preventing contamination and or water to enter the gap.

In an embodiment, the sealing member may be arranged to cover at least a portion of a surface of the pre-exposure element 334 and a surface of the stage system (not illustrated in FIG. 5). The sealing member may comprise a metallic film, for example a stainless steel film. The sealing member may comprise synthetic materials forming, for example, a polyimide film, a fluoropolymer film, or a polyester film.

A liquid repellence treatment may be performed at a surface of the sealing member. This may be beneficial for removal of liquids, for example, droplets at a surface of the sealing member.

In an embodiment, the pre-exposure element 334 may comprise a coating layer at a surface, wherein at least a portion of the surface is provided with the coating layer. In an embodiment, the coating layer is a liquid repellent coating. For example, the coating layer is a hydrophobic coating, which may be beneficial when the pre-exposure element 334 is used in an immersion based system, comprising water.

In an embodiment, the pre-exposure element 334 comprises cooling lines. The cooling lines may be arranged in order to prevent thermally induced damage to the pre-exposure element 334 (or to the pre-exposure plate 310, 320, 330), or to minimize a thermally induced change to an optical property of the pre-exposure element 334.

The pre-exposure element 234, 334 (as illustrated by FIG. 4A, 4B, 5) may be removable from the stage system 130, 230 (with reference to FIG. 2, 4A, 4B). Herewith, the pre-exposure element 234, 334 can be replaced or swapped. This may be beneficial, for example, when the pre-exposure element needs 234, 334 to be upgraded or parts need to be replaced or cleaned, the pre-exposure element 234, 334 may be removed from the stage system 130, 230 to perform the required action.

The pre-exposure element 134, 234, 334 may be used during a pre-exposure sequence. The pre-exposure sequence may comprise a series of exposure scans. Each exposure scan is executed in a similar way as a production exposure scan on a production wafer. For example, as a (production) wafer is loaded to the system (e.g., to a lithographic apparatus) and wafer metrology (e.g., wafer alignment and height measurements) is executed, the pre-exposure sequence can be used to (thermally) condition the lithographic apparatus before the production wafers are exposed by means of patterned radiation.

In an embodiment, a set of pre-exposure cycles is executed in combination with reticle alignment, i.e., alignment of the patterning device, between each cycle. In this exemplary embodiment, the pre-exposure sequence comprises the steps of a first reticle alignment, a first pre-exposure cycle, a second reticle alignment, a second pre-exposure cycle, a third reticle alignment, a third pre-exposure cycle, . . . , an m-th reticle alignment, an m-th pre-exposure cycle, and an n-th reticle alignment. The n-th reticle alignment step is used for the actual (production) wafer exposure. The parameters measured and obtained of all reticle alignment steps are used to verify whether the thermal drift, for example the parametric change as illustrated in FIG. 3, has saturated or has become stable. In order to achieve the thermal drift saturation with minimal time, the pre-exposure sequence is optimized in such a way that the parameters of each exposure as used for the pre-exposure is in accordance with the exposure parameters as used during exposure of the (production) wafers. With reference to above, at the saturated or conditioned state, the mathematical models may provide more correction potential to correct or to compensate for the radiation induced effects.

Figure 6:
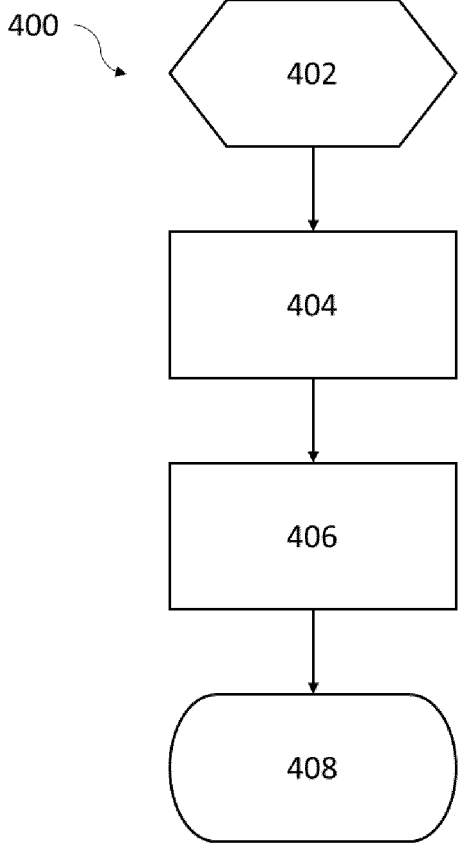
FIG. 6 is a flow chart of a method for a pre-exposure sequence according to some aspects of the present disclosure or portion(s) thereof.

FIG. 6 depicts a flow chart of a method for a pre-exposure sequence 400 according to some aspects of the present disclosure. The method is suitable for thermally conditioning and stabilizing an optical system 100, for example, a lithographic apparatus LA. The method may be used in the lithographic apparatus LA as illustrated in FIG. 1.

At a defining step 402, the pre-exposure parameters are defined. These parameters are determined by the exposure parameters, which are used during the actual exposures of the (production) wafers. These parameters (or exposure settings) comprise: (i) exposure energy per exposure scan (e.g., dose per pulse and number of pulses), (ii) exposure scan speed, (iii) number of pre-exposure cycles, (iv) number of exposure scans per pre-exposure cycle, (v) illumination mode, (vi) lens settings of the projection system 120, and/or (vii) setting of the pre-exposure element 134, 234, 334 (i.e., setting the optical parameter). The setting of the pre-exposure element 134, 234, 334 defines the optical parameter setting of the second optical element 254, as arranged in pre-exposure element 234 (with reference to FIGS. 4A and 4B), or which pre-exposure plate 310, 320, 330 to be used and at which setting (in case of a tuneable pre-exposure plate 310, 320, 330) as arranged at pre-exposure element 334 (with reference to FIG. 5). Hence, control and setting of the optical parameter of the pre-exposure element 134, 234, 334 provides adjusting the pre-exposure element 134, 234, 334 to a defined reflectivity state.

At an initialization step 404, the exposure apparatus is initialized according to the pre-exposure parameters as defined in the defining step 402. During initialization of the apparatus, controller 140 may provide an illumination control signal 142 to configure the illuminator (e.g., the illuminator 102 as illustrated in FIG. 2) regarding illumination mode, an projection control signal 144 to configure the settings of patterning device 112 and the lens elements in the projection system 120, and a stage control signal 146 to arrange the pre-exposure element 134 at the optical path underneath the projection system 120. The stage control signal 146 may also comprise an electronic control signal to set the optical parameter of the pre-exposure element 134, 234, 334 as explained above. The initialization step 404 may further comprise; setting the radiation source SO according to the defined dose or energy per pulse.

As the exposure apparatus is initialized for the pre-exposure sequence 400 by the initialization step 404, the pre-exposure cycle starts at an exposure step 406 as the exposure radiation is provided. At the exposure step 406, exposure radiation 104 is provided by the illuminator 102 towards the patterning device 112, where it passes through, and herewith forming patterned radiation 106. The patterned radiation 106 propagates via the projection system 120 onto the pre-exposure element 134. Defined by the optical parameter setting of the pre-exposure element 134, at least a portion of reflected radiation 108 is received by the projection system 120 and propagates upwards. As a result of the exposure step, the projection system 120 (and/or patterning device 112) interacts with the patterned radiation 106 and the reflected radiation 108, which is likely to result in a change of temperature of the projection system 120 (and/or patterning device 112), and herewith conditioning the optical system. By the dual interaction, the interaction with patterned radiation 106 and reflected radiation 108, the projection system 120 reaches its thermal equilibrium at an earlier stage than in the case wherein only the patterned radiation 106 interacts with the projection system 120 (and patterning device 112).

At the end step 408, the pre-exposure sequence 400 is stopped. This may be obtained by not providing exposure radiation 104, for example, by means of the illuminator 102 or the radiation source SO. The pre-exposure sequence may be stopped by switching the pre-exposure element 134 to a non-reflective mode, such that the patterned radiation 106 is not reflected to the projection system 120 by the pre-exposure element 134. Stopping the pre-exposure sequence may also be obtained by moving the pre-exposure element 134 with respect to the projection system 120, by means of the stage system 130, such that no patterned radiation 106 reaches the exposure element 134. In the latter case, the pre-exposure sequence 400 may be followed by exposure of (production) wafers, for example, when the pre-exposure sequence 400 is used to thermally condition the lithographic apparatus 100 before starting wafer lot production.

Figure 7:
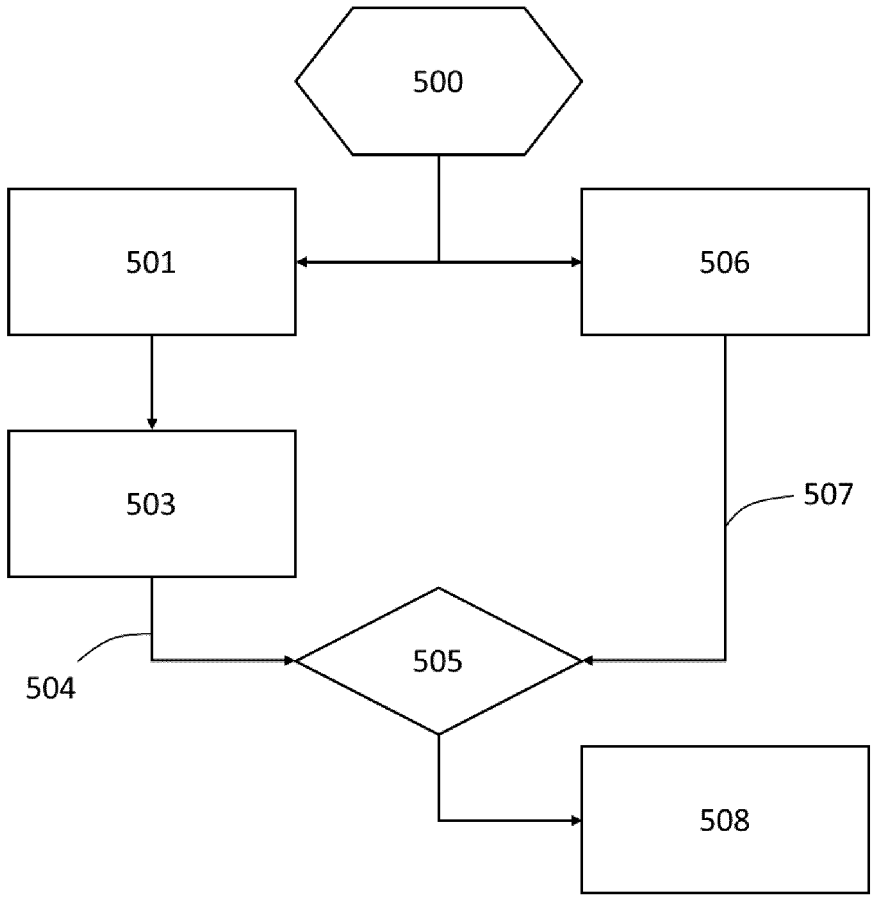
FIG. 7 is a flow chart of a method for an exposure sequence according to some aspects of the present disclosure or portion(s) thereof.

FIG. 7 illustrates a flow chart of a method of using some aspect of the pre-exposure sequence 400 according to the present disclosure. The method is suitable for thermally conditioning and stabilizing an optical apparatus 100, for example, a lithographic apparatus LA as illustrated in FIG. 1. The method may be used in the optical system 100, as illustrated in FIG. 2, and executed by controller 140.

At a first step 500, an exposure sequence is started. The first step 500 may initiate the start of a loading step 501 and a pre-exposure step 506. Both the loading step 501 and the pre-exposure step 506 may be executed in parallel. For example, in a dual stage lithographic apparatus that comprises a first stage and a second stage (e.g., stage system 130), the loading step 501 may be executed at the first stage and the pre-exposure step 506 may be executed at the second stage. Details of both steps are given next.

At the loading step 501, a substrate (or wafer) is loaded onto a substrate holder at the first stage. The substrate holder may be the substrate support WT or the stage system 130 as illustrated in FIG. 1 or FIG. 2, respectively.

After loading the substrate at the loading step 501, a metrology step 503 follows. During the metrology step 503, the positions of features, e.g., alignment marks, provided at the substrate are measured and determined, and the height of the substrate is measured, for example, by means of an alignment sensor and a height or level sensor, respectively. The obtained metrology information is used to position the substrate at the desired location and height for exposure of the substrate, as explained above in reference to FIG. 1.

At the pre-exposure step 506, at least a portion of the method according to the pre-exposure sequence 400 (as illustrated by FIG. 6) is executed. The pre-exposure step 506 may comprise the initialization step 404 and the exposure step 406. The defining step 402 may be done before the first step 500, but may also be part of the pre-exposure step 506.

At a confirmation step 505, the controller 140 may wait until it receives a confirmation signal confirming that the metrology measurements at the metrology step 503 are finished and or that the apparatus is (thermally) stabilized by means of the pre-exposure step 506. A metrology confirmation signal 504 may indicate that the alignment and height measurements are performed. A pre-exposure confirmation signal 507 may indicate that the defined pre-exposure scans are performed, as set by the defining step 402, or that the apparatus reached a (thermally) stable state. By receiving both confirmation signals 504, 507, the lithographic apparatus is ready for exposing the (production) wafers. At the production exposure step 508, the wafer that was loaded and measured at the loading step 501 and metrology step 503, respectively, is positioned underneath the projection system 120 in order to be exposed with radiation according to the defined exposure parameters. The production exposure step 508 may comprise a swap of the substrate supports, so-called chuck swap in a dual stage system.

In a situation that the pre-exposure confirmation signal 507 is received (at step 505) before the metrology confirmation signal 504 is received, one or more exposure steps 406 may be executed in addition. This may be beneficial for keeping the optical system 100, or the lithographic apparatus LA, in the (thermally) stable state.

In a situation that the metrology confirmation signal 504 is received before the pre-exposure confirmation signal 507 is received, additional metrology steps 503 may be executed. This may be beneficial to monitor and or to mitigate drifts (or position changes) of the substrate until the pre-exposure confirmation signal 507 is received.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention, where the context allows, is not limited to optical lithography and may be used in other applications, for example imprint lithography, e-beam lithography, or directed self-assembly.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM);

magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Aspects of the invention are set out in the clauses below.
1. A stage system, comprising: a pre-exposure element for conditioning an optical system, the pre-exposure element having a radiation receiving area at a surface of the stage system, wherein the radiation receiving area comprises at least one pre-exposure plate configured to receive radiation; and a controller, wherein the controller is capable to control an optical parameter of the pre-exposure element, herewith controlling a portion of received radiation reflected by the pre-exposure element.

2. The stage system according to clause 1, wherein the pre-exposure element further comprises an at least partially reflective optical member and the controller is arranged to control the optical property of the pre-exposure element by controlling the reflectivity of the at least partially reflective optical member.

3. The stage system according to clause 2, wherein the reflectivity of the at least partially reflective optical member is controlled by a rotation of the at least partially optical member around a point on a central axis at the at least partially reflective optical member.

4. The stage system according to clause 2, wherein the at least partially reflective optical member is an electro-tuneable optical element that is capable to change between a reflective state and a transmissive state by means of an electric signal.

5. The stage system according to any preceding clause, wherein the pre-exposure element is purged with a purging fluid.

6. The stage system according to any preceding clause, wherein the pre-exposure element comprises one or more detectors to measure a radiation intensity, being a measure for the received radiation.

7. The stage system according to clause 1, comprising a plurality of pre-exposure plates, each pre-exposure plate having a reflectivity different from each other, wherein the optical parameter of the pre-exposure element is controlled by selecting one from the plurality of pre-exposure plates.

8. The stage system according to clause 7, wherein at least one pre-exposure plate is an electrotuneable optical element that is capable to change between a reflective state and a transmissive state by means of an electric signal.

9. The stage system according to clause 1, 7 or 8, wherein the pre-exposure element comprises cooling lines.

10. The stage system according to any preceding clause, wherein the pre-exposure element is arranged in a pocket at the surface of the stage system 11. The stage system according to any preceding clause, wherein the radiation receiving area having a surface at substantially a same height as the surface of the stage system.

12. The stage system according to any preceding clause, wherein a sealing member is provided to close a gap between the stage system and the pre-exposure element.

13. The stage system according to any preceding clause, wherein the pre-exposure element is removable from the stage system.

14. The stage system according to any preceding clause, wherein at least a portion of a surface of the pre-exposure element comprises a coating layer.

15. The stage system according to any preceding clause, wherein the stage system is arranged to support a substrate.

16. An optical system comprising the stage system according to any preceding clause.

17. A method of conditioning an optical system, the method comprising: defining exposure parameters of the optical system, for exposing one or more substrates; initializing the optical system according to the defined exposure parameters, herewith at least controlling and setting an optical parameter of a pre-exposure element;

exposing the pre-exposure element with radiation, using at least the radiation reflected from the pre-exposure element for conditioning the optical system; and stopping the exposure of the pre-exposure element with radiation, as the optical system is at a conditioned state.

18. The method according to clause 17, wherein setting the optical parameter of the pre-exposure element is adjusting the pre-exposure element to the a defined reflectivity state.

19. The method according to clause 17 or 18, further comprising: loading a substrate onto a substrate holder; measuring at least a position of a feature at the substrate, using an alignment sensor; measuring a height of the substrate, using a height sensor; receiving at a controller a signal indicating that at least one of the position measurement, the height measurement, and the exposure of the pre-exposure element is finished.

20. A substrate exposure method comprising applying the method according to clause 19, further comprising exposing the substrate with radiation according the defined exposure parameters.

21. A pre-exposure element for conditioning an optical system, the pre-exposure element having a radiation receiving area at a surface of a stage system, wherein the radiation receiving area comprises at least one pre-exposure plate configured to receive radiation; and a controller, wherein the controller is capable to control an optical parameter of the pre-exposure element, herewith controlling a portion of received radiation reflected by the pre-exposure element.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A stage system configured to receive radiation from an optical system, the stage system comprising:
a pre-exposure element disposed in a surface of the stage system and configured to condition the optical system, the pre-exposure element having a radiation receiving area at a top surface of the stage system,
wherein the radiation receiving area comprises at least one pre-exposure plate configured to receive radiation from the optical system that is incident at the top surface of the stage system; and
wherein the pre-exposure element is configured to receive a control signal to control an optical parameter of the pre-exposure element, thereby controlling a portion of the received radiation and reflecting the portion of the received radiation back to the optical system for the conditioning.

2. The stage system of claim 1, wherein the pre-exposure element further comprises an at least partially reflective optical member, and wherein the pre-exposure element is configured to receive a control signal to control the optical property of the pre-exposure element by controlling the reflectivity of the at least partially reflective optical member.

3. The stage system of claim 2, wherein the reflectivity of the at least partially reflective optical member is controlled by a rotation of the at least partially optical member around a point on a central axis at the at least partially reflective optical member.

4. The stage system of claim 2, wherein the at least partially reflective optical member is an electrotuneable optical element configured to change between a reflective state and a transmissive stage based on an electric signal.

5. The stage system of claim 1, wherein the pre-exposure element is purged with a purging fluid.

6. The stage system of claim 1, wherein the pre-exposure element comprises one or more detectors configured to measure a radiation intensity.

7. The stage system of claim 1, further comprising a plurality of pre-exposure plates, each pre-exposure plate having a reflectivity different from each other, wherein the optical parameter of the pre-exposure element is controlled by selecting one from the plurality of pre-exposure plates.

8. The stage system of claim 7, wherein at least one pre-exposure plate is an electrotuneable optical element configured to change between a reflective state and a transmissive state by means of an electric signal.

9. The stage system of claim 1, wherein the pre-exposure element comprises cooling lines.

10. The stage system of claim 1, wherein the pre-exposure element is arranged in a pocket at the surface of the stage system.

11. The stage system of claim 1, wherein the radiation receiving area has a surface at substantially a same height as the surface of the stage system.

12. The stage system of claim 1, further comprising a sealing member is provided to close a gap between the surface of the stage system and the pre-exposure element.

13. The stage system of claim 1, wherein the pre-exposure element is removable from the stage system.

14. The stage system of claim 1, wherein at least a portion of a surface of the pre-exposure element comprises a coating layer.

15. An optical system comprising;

a stage system configured to receive radiation, comprising:

a pre-exposure element disposed in a surface of the stage system and configured to condition an optical system, the pre-exposure element having a radiation receiving area at a top surface of the stage system, wherein the radiation receiving area comprises at least one pre-exposure plate configured to receive radiation; and wherein the pre-exposure element is configured to receive a control signal to control an optical parameter of the pre-exposure element, thereby controlling a portion of the received radiation and reflecting the portion of the received radiation back to the optical system for the conditioning.

16. A pre-exposure element for conditioning an optical system, comprising:

a radiation receiving area at a top surface of a stage system, wherein the radiation receiving area comprises at least one pre-exposure plate configured to receive radiation from the optical system that is incident at the top surface of the stage system; and wherein the pre-exposure element is configured to receive a control signal to control an optical parameter of the pre-exposure element, thereby controlling a portion of the received radiation and reflecting the portion of the received radiation back to the optical system for the conditioning.

\* \* \* \* \*